(12) United States Patent
Minoshima et al.

(10) Patent No.: US 12,072,215 B2
(45) Date of Patent: Aug. 27, 2024

(54) CAPACITIVE COUPLING SENSOR

(71) Applicant: Sumitomo Riko Company Limited, Aichi (JP)

(72) Inventors: Ryo Minoshima, Aichi (JP); Kazutaka Katayama, Aichi (JP); Tomohiro Fukuta, Aichi (JP)

(73) Assignee: Sumitomo Riko Company Limited, Aichi (JP)

( * ) Notice: Subject to any disclaimer, the term of this patent is extended or adjusted under 35 U.S.C. 154(b) by 408 days.

(21) Appl. No.: 17/396,785

(22) Filed: Aug. 9, 2021

(65) Prior Publication Data

US 2021/0362767 A1 Nov. 25, 2021

Related U.S. Application Data

(63) Continuation of application No. PCT/JP2019/049788, filed on Dec. 19, 2019.

(30) Foreign Application Priority Data

Mar. 27, 2019 (JP) ................. 2019-059653

(51) Int. Cl.
*G01D 5/24* (2006.01)
*B62D 1/06* (2006.01)
(Continued)

(52) U.S. Cl.
CPC ............... *G01D 5/24* (2013.01); *B62D 1/065* (2013.01); *H03K 17/955* (2013.01); *H05B 3/16* (2013.01); *H05B 3/34* (2013.01); *H05B 2203/013* (2013.01)

(58) Field of Classification Search
CPC ........ B32B 2250/24; B32B 2262/0284; B32B 2262/12; B32B 2264/102; B32B 2270/00;
(Continued)

(56) References Cited

U.S. PATENT DOCUMENTS

| 7,534,957 B2 | 5/2009 | Yamaura et al. |
| 11,029,438 B2 | 6/2021 | Takamatsu et al. |

(Continued)

FOREIGN PATENT DOCUMENTS

| CN | 105067159 | 11/2015 |
| JP | 2007123202 | 5/2007 |

(Continued)

OTHER PUBLICATIONS

"Written Opinion of the International Searching Authority (Form PCT/ISA/237) of PCT/JP2019/049788," mailed on Mar. 3, 2020, with English translation thereof, pp. 1-10.

(Continued)

*Primary Examiner* — Alexander Satanovsky
*Assistant Examiner* — Brent J Andrews
(74) *Attorney, Agent, or Firm* — JCIPRNET

(57) ABSTRACT

A capacitive coupling sensor (1) is equipped with a sensor unit (10) which has: a detection electrode layer (11) which generates capacitance between the detection electrode layer (11) and a detection target, a shield electrode layer (12), and an insulation layer (13) which is arranged between the detection electrode layer (11) and the shield electrode layer (12), wherein the insulation layer (13) has a cross-linked polymer obtained by cross-linking of a thermoplastic polymer. The capacitive coupling sensor (1) has high heat resistance, can be made thinner, and has an excellent tactile quality.

12 Claims, 3 Drawing Sheets

(51) Int. Cl.
*H03K 17/955* (2006.01)
*H05B 3/16* (2006.01)
*H05B 3/34* (2006.01)

(58) Field of Classification Search
CPC .......... B32B 2274/00; B32B 2307/304; B32B 2307/306; B32B 2307/536; B32B 2307/54; B32B 2307/732; B32B 2605/003; B32B 27/12; B32B 27/18; B32B 27/325; B32B 5/02; B62D 1/046; B62D 1/065; G01D 5/24; G01V 3/08; H01H 2239/006; H03K 17/955; H03K 17/962; H03K 2217/960705; H03K 2217/960755; H03K 2217/960765; H05B 2203/013; H05B 3/16; H05B 3/34; H05B 3/342; H05B 1/00; H05B 3/00; H05B 6/00; H05B 7/00; H05B 11/00; H05B 31/00; H05B 33/00; H05B 35/00; H05B 39/00; H05B 41/00; H05B 44/00; H05B 45/00; H05B 46/00; H05B 47/00; H05B 2203/00; H05B 2206/00; H05B 2213/00; H05B 2214/00

See application file for complete search history.

(56) References Cited

U.S. PATENT DOCUMENTS

| 2014/0318826 | A1* | 10/2014 | Cai | H01B 7/36 |
| | | | | 174/112 |
| 2015/0268106 | A1 | 9/2015 | Otaka et al. | |
| 2015/0369633 | A1* | 12/2015 | Karasawa | B62D 1/04 |
| | | | | 324/686 |
| 2017/0355391 | A1 | 12/2017 | Wittkowski et al. | |
| 2018/0134010 | A1 | 5/2018 | Branigan et al. | |
| 2018/0141274 | A1* | 5/2018 | Fink | H01B 13/14 |
| 2018/0292148 | A1* | 10/2018 | Watanabe | B32B 27/12 |
| 2020/0275522 | A1 | 8/2020 | Chervyakov et al. | |

FOREIGN PATENT DOCUMENTS

| JP | 2014081355 | 5/2014 |
| JP | 2014190856 | 10/2014 |
| JP | 2016165940 | 9/2016 |
| JP | 2017084783 | 5/2017 |
| JP | 2020530697 | 10/2020 |
| WO | 2014123222 | 8/2014 |
| WO | 2019077788 | 4/2019 |

OTHER PUBLICATIONS

"International Search Report (Form PCT/ISA/210) of PCT/JP2019/049788," mailed on Mar. 3, 2020, with English translation thereof, pp. 1-4.

"Office Action of Japan Counterpart Application", with English translation thereof, issued on Sep. 29, 2020, pp. 1-7.

"Office Action of Japan Counterpart Application", with English translation thereof, issued on Dec. 22, 2020, pp. 1-6.

"Search Report of Europe Counterpart Application", issued on Feb. 23, 2022, p. 1-p. 8.

* cited by examiner

CAPACITIVE COUPLING SENSOR

CROSS-REFERENCE TO RELATED APPLICATIONS

This application is a continuation application of International Application number PCT/JP2019/049788, filed on Dec. 19, 2019, which claims the priority benefit of Japan Patent Application No. 2019-059653 filed on Mar. 27, 2019. The entirety of each of the above-mentioned patent applications are hereby incorporated by reference herein and made a part of this specification.

BACKGROUND

Technical Field

The present disclosure relates to a capacitive coupling sensor which is arranged in a steering wheel, interior components, and the like of a vehicle and is capable of detecting proximity, contact, and the like of a person.

Related Art

Various sensors that detect the state of an occupant are mounted on vehicles such as automobiles and the like. For example, Patent literatures 1 to 3 disclose a contact sensor which is arranged in a rim unit (a grip) of a steering wheel. The contact sensor includes a detection electrode layer and a shield electrode layer, and detects whether or not a driver is in contact with the steering wheel based on the change in capacitance generated between the occupant and the detection electrode layer. On the other hand, the rim unit becomes cold in winter and in cold regions. A steering wheel in which a heater is attached to the rim unit is known in order to reduce the difficulty of driving and the discomfort caused by the cold rim unit. In the steering wheel described in Patent literatures 1 to 3, the heater is arranged on a lower side (a core body side) of the contact sensor.

LITERATURE OF RELATED ART

Patent Literature

Patent literature 1: Japanese Patent Laid-Open No. 2014-190856
Patent literature 2: International Publication No. WO 2014/123222
Patent literature 3: Japanese Patent Laid-Open No. 2016-165940
Patent literature 4: Japanese Patent Laid-Open No. 2017-84783

FIG. 5 shows a radial cross-sectional view of a conventional steering wheel including a contact sensor and a heater layer. As shown in FIG. 5, a steering wheel 9 includes a core body 20, a heater layer 30, a contact sensor 90, and a skin layer 40. The steering wheel 9 has a lamination structure in which a plurality of layers are laminated from the core body 20 toward the outside in the radial direction. The heater layer 30 covers an outer peripheral surface of the core body 20. The contact sensor 90 covers an outer peripheral surface of the heater layer 30. The skin layer 40 covers an outer peripheral surface of the contact sensor 90. The driver touches the skin layer 40.

The contact sensor 90 has a detection electrode layer 91, a shield electrode layer 92, and an insulation layer 93. The detection electrode layer 91 is arranged on the skin layer 40 side, and generates capacitance between the detection electrode layer 91 and the driver's hand (a detection target). The shield electrode layer 92 is arranged on the heater layer 30 side, and shields noise from the heater layer 30. The insulation layer 93 is arranged between the detection electrode layer 91 and the shield electrode layer 92. An adhesive layer 94 is arranged between the detection electrode layer 91 and the insulation layer 93. An adhesive layer 95 is arranged between the shield electrode layer 92 and the insulation layer 93. The adhesive layers 94 and 95 adhere two adjacent layers. Similarly, an adhesive layer 31 is arranged between the heater layer 30 and the shield electrode layer 92. The adhesive layer 31 adheres the heater layer 30 and the shield electrode layer 92. An adhesive layer 41 is arranged between the skin layer 40 and the detection electrode layer 91. The adhesive layer 41 adheres the skin layer 40 and the detection electrode layer 91.

For example, as described in Patent literature 4, the heater layer 30 is configured by arranging a heating wire of a heat source on a nonwoven fabric or the like. Because the contact sensor 90 is adjacent to the heater layer 30, it is desirable to improve heat resistance from the viewpoint of fail-safe. In addition, the contact sensor 90 is preferably as thin as possible from the viewpoint of improving the ease of gripping the steering wheel 9. Furthermore, it is also important that the heat from the heater layer 30 is efficiently transferred to the skin layer 40.

In consideration of the feeling when the driver grips the steering wheel 9, a foamed resin such as a polyethylene foam or the like is used in the insulation layer 93 of the contact sensor 90. However, the heat resistance and the thermal conductive property of the foamed resin are not sufficient. In addition, if the foamed resin is made thinner, the insulation property may be lowered and the function of the sensor may be inhibited, and thus a certain degree of thickness is required for the insulation layer 93.

Moreover, in the conventional steering wheel 9, the laminated layers are adhered to each other by an adhesive. That is, the adhesive layers 31, 95, 94, and 41 are sequentially arranged toward the outside in the radial direction between the layers. Therefore, the steering wheel 9 becomes thicker by these thicknesses. In addition, because a step of coating an adhesive and other steps are required, the number of manufacturing steps is increased, and the cost also becomes high. Moreover, when a solvent-based adhesive is used, the front surface of the layer on which the adhesive is coated may be dissolved, and the thickness of the layer may be changed. In addition, because the thermal conductivity of the adhesive layer is not large, the thermal conductive property is lowered by the amount of the thermal resistance of each adhesive layer. In addition, when the adhesive is impregnated in the foamed resin of the insulation layer 93, an interface between the insulation layer 93 and the detection electrode layer 91 adjacent to the insulation layer 93 and an interface between the insulation layer 93 and the shield electrode layer 92 adjacent to the insulation layer 93 become uneven, and the distance between the electrode layers is changed. Thereby, the capacitance may be changed and the detection precision of the contact sensor 90 may be lowered.

The present disclosure is accomplished in view of this circumstance, and an object is to provide a capacitive coupling sensor which has high heat resistance, can be made thinner, and has an excellent tactile quality.

SUMMARY

The capacitive coupling sensor of the present disclosure includes a sensor unit which has a detection electrode layer which generates capacitance between the detection electrode layer and a detection target, a shield electrode layer, and an insulation layer which is arranged between the detection electrode layer and the shield electrode layer, wherein the insulation layer has a cross-linked polymer obtained by cross-linking of a thermoplastic polymer.

DESCRIPTION OF THE EMBODIMENTS

Figure 1:
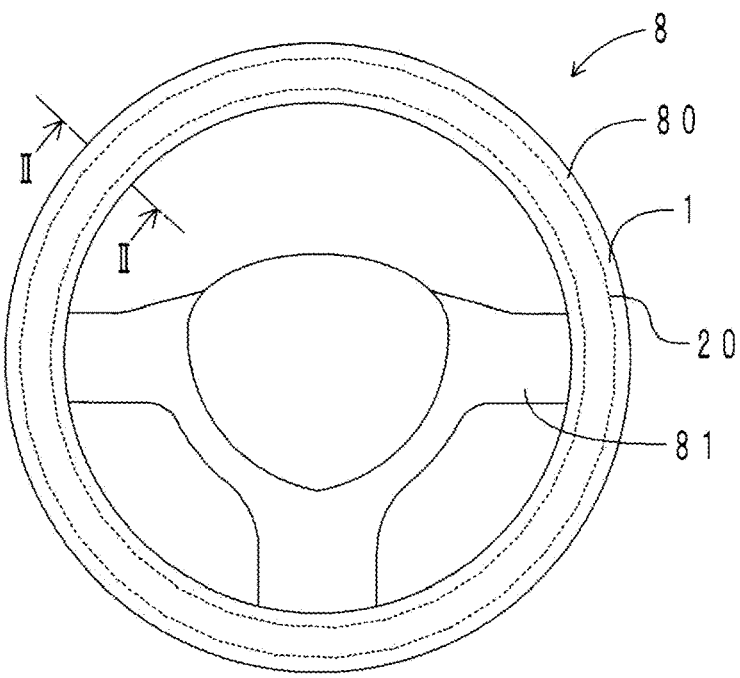
FIG. 1 is a front view of a steering wheel in which a capacitive coupling sensor of a first embodiment is arranged.

In the capacitive coupling sensor of the present disclosure, the cross-linked polymer is used in the insulation layer. The cross-linked polymer has excellent heat resistance as compared with the foamed resin. Therefore, the reliability is improved when the capacitive coupling sensor is used at a high temperature, for example, in summer or the like, or when the insulation layer is arranged in the vicinity of the heater layer. The cross-linked polymer has an excellent insulation property as compared with the foamed resin. Therefore, even if the insulation layer is made thinner, the insulation property between the detection electrode layer and the shield electrode layer can be sufficiently ensured, and there is little possibility that a sensor function is inhibited. If the insulation layer is made thinner, the flexibility is improved. Therefore, even if the sensor is arranged in a member touched by a person, the tactile quality is unlikely to be lowered. Moreover, the workability of assembly or the like is improved. In addition, if the insulation layer is made thinner, the thermal capacity and the thermal resistance are reduced, and thus the thermal conduction is unlikely to be inhibited. Therefore, for example, when the capacitive coupling sensor of the present disclosure, in which the heater layer is arranged on the back side of the sensor unit and the skin layer is arranged on the front side, is arranged in the steering wheel, the heat of the heater layer can be quickly transferred to the skin layer, and the time until the steering wheel warms up can be shortened. In addition, because the strength of the cross-linked polymer is higher than that of the foamed resin, the cross-linked polymer has sufficient strength even if it is made thinner, and is also excellent in settling resistance and chemical resistance. Therefore, the insulation layer has excellent durability, and even if the insulation layer and the detection electrode layer are adhered to each other by using an adhesive, and the insulation layer and the shield electrode layer are adhered to each other by using an adhesive, the front surface of the insulation layer is less rough, and the adhesive is unlikely to be impregnated in the insulation layer.

The cross-linked polymer is a cross-linked product of the thermoplastic polymer. The thermoplastic polymer is softened by heating. Therefore, by heating the thermoplastic polymer, fusion to the adjacent electrode layer and the cross-linking can be performed at the same time. Thereby, the detection electrode layer and the insulation layer, and the shield electrode layer and the insulation layer can be fixed without using an adhesive as in the conventional case. In this case, the step of coating an adhesive is not required. Therefore, the manufacturing steps and the cost can be reduced. In addition, because the adhesive is not coated, the front surfaces of the electrode layer and the insulation layer are unlikely to be roughened by the solvent. Therefore, the layers are unlikely to be separated from each other and the reliability is improved. In addition, the adhesive is also not impregnated in the insulation layer. Therefore, the distance between the detection electrode layer and the shield electrode layer is unlikely to be changed, and the detection precision of the sensor can be maintained. In addition, because no adhesive layer is interposed between the electrode layer and the insulation layer, the sensor can be made thinner by the thickness of the adhesive layer. As a result, the thermal resistance is reduced and the thermal conductive property is also improved. Furthermore, designability of the sensor is also improved.

Embodiments of a capacitive coupling sensor of the present disclosure are described below.

First Embodiment

[Configuration]

Figure 2:
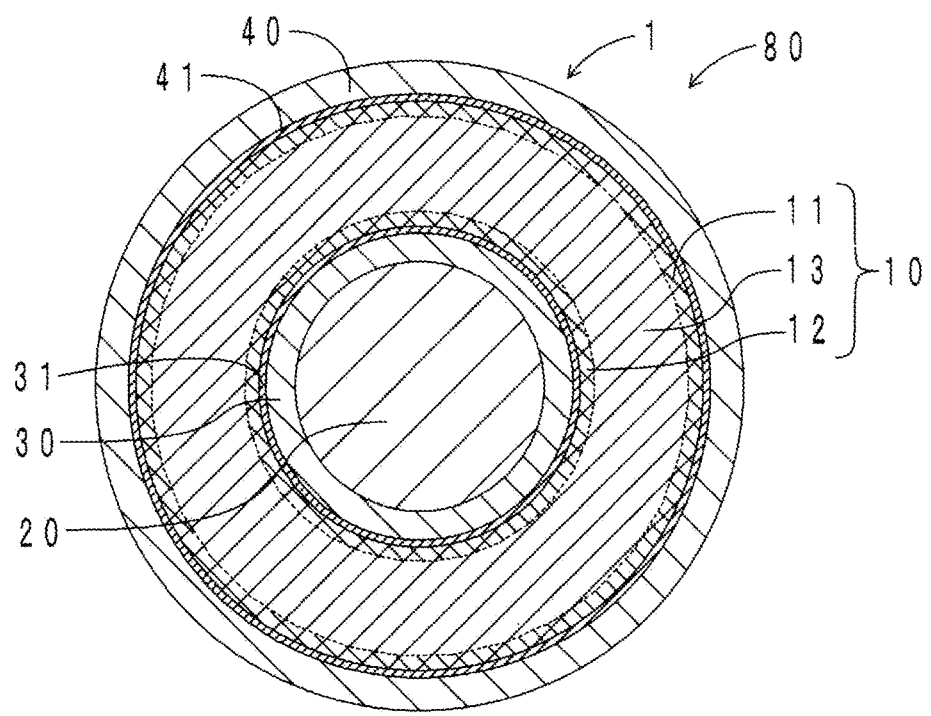
FIG. 2 is a cross-sectional view taken along a line II-II in FIG. 1.
Figure 3:
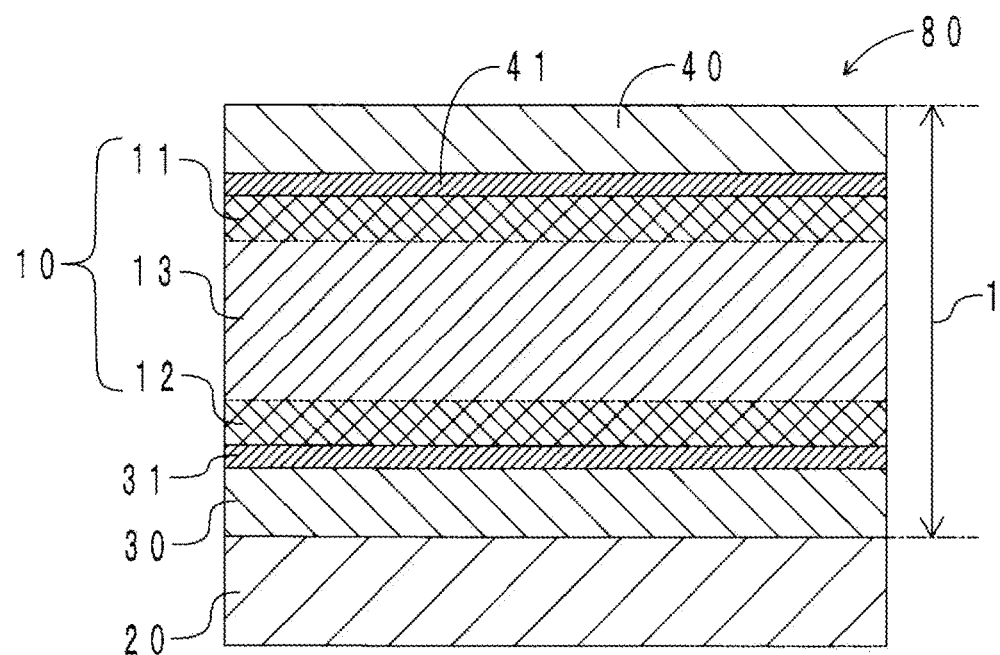
FIG. 3 is a schematic cross-sectional view for describing a lamination structure of the steering wheel.

First, a configuration of a capacitive coupling sensor of the embodiment is described. FIG. 1 shows a front view of a steering wheel in which the capacitive coupling sensor of the embodiment is arranged. FIG. 2 shows a cross-sectional view taken along a line II-II in FIG. 1. FIG. 3 shows a schematic cross-sectional view for describing a lamination structure of the steering wheel.

As shown in FIG. 1, a steering wheel 8 has a rim unit 80 and a connection unit 81. The rim unit 80 has a ring shape, and is gripped by a driver. The connection unit 81 connects the rim unit 80 and a steering shaft (not shown). The rim unit 80 has a core body 20 (shown by a dotted line in FIG. 1) and a capacitive coupling sensor 1.

As shown in FIG. 2 and FIG. 3, the core body 20 is a solid rod made of metal and has a ring shape. The core body 20 is connected to the steering shaft via the connection unit 81.

The capacitive coupling sensor 1 has a flexible sheet shape. The capacitive coupling sensor 1 is wound (one roll) around the core body 20. The capacitive coupling sensor 1 has a sensor unit 10, a heater layer 30, and a skin layer 40.

The heater layer 30 has a nonwoven fabric and a heating wire (not shown) embedded in the nonwoven fabric. The heater layer 30 covers an outer peripheral surface of the core body 20. The heater layer 30 heats the rim unit 80 by generating heat from the heating wire by energization. The sensor unit 10 is arranged so as to cover an outer peripheral surface of the heater layer 30. An adhesive layer 31 is arranged between the heater layer 30 and the sensor unit 10. The adhesive layer 31 adheres the heater layer 30 and the sensor unit 10 (specifically, a shield electrode layer 12 described later). The skin layer 40 is made of polyurethane, and is arranged so as to cover an outer peripheral surface of the sensor unit 10. An adhesive layer 41 is arranged between the skin layer 40 and the sensor unit 10. The adhesive layer 41 adheres the skin layer 40 and the sensor unit 10 (specifically, a detection electrode layer 11 described later). The sensor unit 10 has the detection electrode layer 11, the shield electrode layer 12, and an insulation layer 13.

The detection electrode layer 11 is made of a conductive cloth. A volume resistivity of the detection electrode layer 11 is in the order of $10^{-2}$ Ω·cm. The detection electrode layer 11 is arranged on the skin layer 40 side, and generates capacitance between the detection electrode layer 11 and the driver's hand (a detection target). As shown by dotted lines in FIG. 2 and FIG. 3, the detection electrode layer 11 is almost entirely embedded in the insulation layer 13. The shield electrode layer 12 is made of the same conductive cloth as the detection electrode layer 11. The shield electrode layer 12 is arranged on the heater layer 30 side. The shield electrode layer 12 is grounded and shields noise from the heater layer 30. As shown by the dotted lines in FIG. 2 and FIG. 3, the shield electrode layer 12 is almost entirely embedded in the insulation layer 13.

The insulation layer 13 is arranged between the detection electrode layer 11 and the shield electrode layer 12. The insulation layer 13 has a cross-linked polymer, a magnesium oxide particle, and a magnesium hydroxide particle. The cross-linked polymer is a cross-linked product of a styrene-based thermoplastic elastomer and an olefin-based thermoplastic elastomer. The styrene-based thermoplastic elastomer and the olefin-based thermoplastic elastomer are included in the concept of a thermoplastic polymer in the present disclosure. The thermal conductivity of the magnesium oxide particle is 45 W/m·K. The thermal conductivity of the magnesium hydroxide particle is 8 W/m·K. In the insulation layer 13, the magnesium oxide particle plays a role of increasing the thermal conductive property, and the magnesium hydroxide particle plays a role of increasing the flame retardant property and a role of increasing the thermal conductive property. The magnesium oxide particle and the magnesium hydroxide particle are included in the concept of an insulation particle in the present disclosure. The thickness of the insulation layer 13 is 0.6 mm. The thermal conductivity of the insulation layer 13 is 0.66 W/m·K, the volume resistivity is $1 \times 10^{14}$ Ω·cm, and the type A durometer hardness is 80.

[Manufacturing Method]

Next, a manufacturing method of the capacitive coupling sensor of the embodiment is described. First, the styrene-based thermoplastic elastomer, the olefin-based thermoplastic elastomer, magnesium oxide powder, magnesium hydroxide powder, and an organic peroxide which is used as a cross-linking agent are kneaded to prepare a polymer composition. Next, the polymer composition is heat-pressed at 130° C. to manufacture a polymer sheet (a polymer sheet manufacturing step). At this point of time, the cross-linking of the thermoplastic elastomer has not yet been completed. Subsequently, a conductive cloth for the detection electrode layer 11 is stacked on the front surface of the polymer sheet, and a conductive cloth for the shield electrode layer 12 is stacked on the back surface, and thereby a lamination body is made (a lamination step). Finally, the lamination body is heat-pressed at 180° C. for 30 minutes. Thereby, the polymer sheet is softened and is fused while being impregnated in the conductive cloth, and the cross-linking of the thermoplastic elastomer is completed (a cross-linking adhesion step). At the same time, the conductive cloths (the detection electrode layer 11 and the shield electrode layer 12) are embedded in the polymer sheet. In this way, the sensor unit 10 is manufactured.

The manufactured sensor unit 10 is arranged so as to cover an outer peripheral surface of the heater layer 30 previously wound around the core body 20 with the shield electrode layer 12 on the inner side. An adhesive is coated on the front surface of the heater layer 30. Thereby, the heater layer 30 and the shield electrode layer 12 are adhered to each other. Then, the skin layer 40 is arranged so as to cover the detection electrode layer 11. An adhesive is coated on the back surface of the skin layer 40. Thereby, the skin layer 40 and the detection electrode layer 11 are adhered to each other. In this way, the capacitive coupling sensor 1 configuring the rim unit 80 of the steering wheel 8 is manufactured.

[Movement of Capacitive Coupling Sensor]

Next, the movement of the capacitive coupling sensor of the embodiment is described. If the driver's hand (which is conductive and is grounded via the human body) approaches the skin layer 40, the capacitance is generated between the detection electrode layer 11 and the hand. A detection circuit unit (not shown) is electrically connected to the detection electrode layer 11. The detection circuit unit calculates the change amount of the capacitance from the state in which the hand is not approaching to the state in which the hand is approaching, and determines whether the driver is in contact with the steering wheel 8 based on the calculated value.

[Action Effect]

Next, an action effect of the capacitive coupling sensor of the embodiment is described. According to the capacitive coupling sensor 1, the insulation layer 13 has a cross-linked polymer. Therefore, the heat resistance of the insulation layer 13 is high, and as a result, the heat resistance of the sensor unit 10 is improved. In addition to the cross-linked polymer, the insulation layer 13 has a magnesium oxide particle and a magnesium hydroxide particle which are insulation particles. Therefore, the volume resistivity of the insulation layer 13 is large, and even if the thickness of the insulation layer 13 is as thin as 0.6 mm, the insulation property between the detection electrode layer 11 and the shield electrode layer 12 can be sufficiently ensured, and the sensor function of the sensor unit 10 is unlikely to be inhibited. Here, the magnesium oxide particle also functions as an acid acceptor. Therefore, it is not necessary to add an acid acceptor separately in the cross-linking by the organic peroxide.

Because the insulation layer 13 is thin, the flexibility is improved, and the workability when the sensor unit 10 is wounded and assembled around the core body 20 is improved. In addition, the detection electrode layer 11 and the shield electrode layer 12 are also made of a flexible conductive cloth. Therefore, the entire capacitive coupling sensor 1 is flexible, and the tactile quality of the rim unit 80 is good. The insulation layer 13 is thin, and further has a magnesium oxide particle with thermal conductivity of 20 W/m·K or more. Moreover, there is no adhesive layer between the insulation layer 13 and the detection electrode layer 11 and between the insulation layer 13 and the shield electrode layer 12. Therefore, the thermal conductive property of the sensor unit 10 is high. Accordingly, the heat of the heater layer 30 can be quickly transferred to the skin layer 40, and the temperature rising time of the rim unit 80 can be shortened. Thereby, even when driving in winter or in a cold region, the driver can quickly feel the warmth, and the difficulty of driving and discomfort are reduced.

In the manufacturing method of the sensor unit 10, by heating and softening the thermoplastic polymer (the styrene-based thermoplastic elastomer and the olefin-based thermoplastic elastomer), the fusions to the adjacent detection electrode layer 11 and shield electrode layer 12 and the cross-linking can be performed at the same time. Accordingly, even if the adhesive is not used, the detection electrode layer 11 and the shield electrode layer 12 can be fixed to the insulation layer 13. In addition, the detection electrode layer 11 and the shield electrode layer 12 are both made of a conductive cloth. Therefore, the softened thermoplastic polymer is impregnated in the conductive cloth, and the detection electrode layer 11 and the shield electrode layer 12 are embedded in the insulation layer 13. Thus, the laminated layers are unlikely to be separated from each other, and the reliability is high. Moreover, because the distance between the detection electrode layer 11 and the shield electrode layer 12 is unlikely to be changed, the detection precision of the sensor unit 10 is maintained. In addition, because the adhesive is not coated, the front surfaces of the insulation layer 13, the detection electrode layer 11, and the shield electrode layer 12 are unlikely to be roughened by the solvent. Besides, the step of coating an adhesive is not required, and the manufacturing steps and the cost can be reduced.

Second Embodiment

The difference between the capacitive coupling sensor of the embodiment and the capacitive coupling sensor of the first embodiment is that the skin layer and the heater layer have the same cross-linked polymer as the insulation layer. Here, the difference is mainly described.

Figure 4:
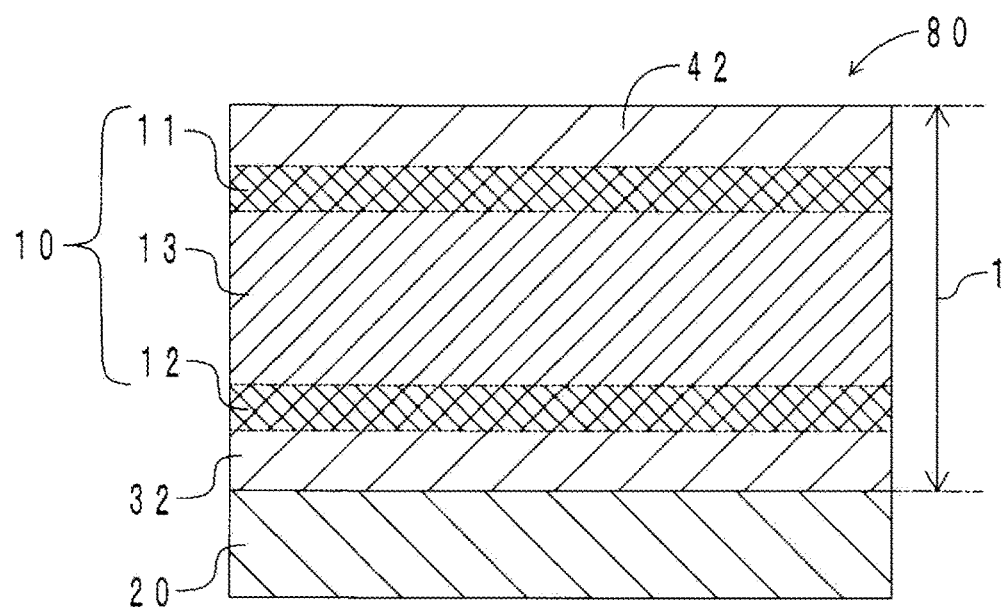
FIG. 4 is a schematic cross-sectional view for describing a lamination structure of a steering wheel in which a capacitive coupling sensor of a second embodiment is arranged.
Figure 5:
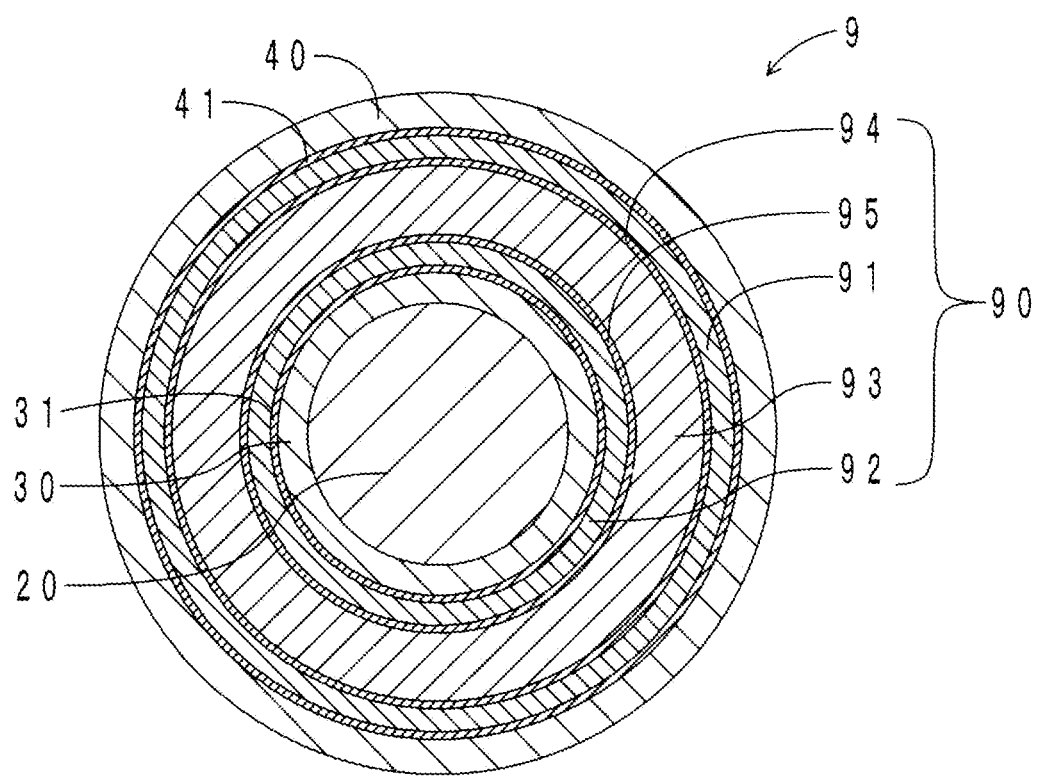
FIG. 5 is a radial cross-sectional view of a conventional steering wheel.

FIG. 4 shows a schematic cross-sectional view for describing a lamination structure of a steering wheel in which a capacitive coupling sensor of the embodiment is arranged. FIG. 4 corresponds to FIG. 3, and the same parts as those in FIG. 3 are indicated by the same reference numerals. In FIG. 4, the core body 20 is hatched in the opposite direction to that in FIG. 3, but there is no change in the configuration. In FIG. 4, the lamination direction from the detection electrode layer 11 toward the shield electrode layer 12 in the sensor unit 10 is defined as a front and back direction.

As shown in FIG. 4, the capacitive coupling sensor 1 has the sensor unit 10, a heater layer 32, and a skin layer 42. As in the first embodiment, the heater layer 32 is arranged on the back side of the sensor unit 10. The heater layer 32 has a cross-linked polymer and a heating wire (not shown) embedded in the cross-linked polymer. The cross-linked polymer is a cross-linked product of the styrene-based thermoplastic elastomer and the olefin-based thermoplastic elastomer, which is the same as that of the insulation layer 13. The thickness of the heater layer 32 is 2.0 mm. No adhesive layer is arranged between the heater layer 32 and the sensor unit 10. As in the first embodiment, the skin layer 42 is arranged on the front side of the sensor unit 10. The skin layer 42 contains the cross-linked polymer, that is, the cross-linked product of the styrene-based thermoplastic elastomer and the olefin-based thermoplastic elastomer, which is the same as that of the insulation layer 13. The thickness of the skin layer 42 is 1.0 mm. No adhesive layer is arranged between the skin layer 42 and the sensor unit 10.

The capacitive coupling sensor 1 is manufactured as follows. First, as in the first embodiment, the polymer composition for the insulation layer 13 is heat-pressed at 130° C. to manufacture a polymer sheet for insulation layer (a manufacturing step of the polymer sheet for insulation layer). Next, the styrene-based thermoplastic elastomer, the olefin-based thermoplastic elastomer, and the organic peroxide which is used as a cross-linking agent are kneaded to prepare a polymer composition for the heater layer 32. Then, the prepared polymer composition for the heater layer 32 is put into a mold together with the heating wire and is heat-pressed at 130° C. to manufacture a polymer sheet for heater layer in which the heating wire is embedded (a manufacturing step of the polymer sheet for heater layer). Similarly, the styrene-based thermoplastic elastomer, the olefin-based thermoplastic elastomer, and the organic peroxide which is used as a cross-linking agent are kneaded to prepare a polymer composition for the skin layer 42. Then, the polymer composition for the prepared skin layer 42 is heat-pressed at 130° C. to manufacture a polymer sheet for skin layer (a manufacturing step of the polymer sheet for skin layer). The cross-linking of the thermoplastic elastomer has not yet been completed in any of the polymer sheets.

Then, the conductive cloth for the detection electrode layer 11 and the polymer sheet for skin layer are sequentially stacked on the front surface of the polymer sheet for insulation layer, and then the conductive cloth for the shield electrode layer 12 and the polymer sheet for heater layer are sequentially stacked on the back surface, and thereby a lamination body is manufactured (a lamination step). Finally, the lamination body is heat-pressed at 180° C. for 30 minutes. Thereby, the polymer sheet of each layer is softened and is fused while being impregnated in the conductive cloth, and the cross-linking of the thermoplastic elastomer is completed (a cross-linking adhesion step). At the same time, the conductive cloths (the detection electrode layer 11 and the shield electrode layer 12) are embedded in the adjacent polymer sheet. In this way, the capacitive coupling sensor 1 having the sensor unit 10, the heater layer 32, and the skin layer 42 is integrally manufactured.

The capacitive coupling sensor of the embodiment and the capacitive coupling sensor of the first embodiment have the same action effect with regard to the parts having a common configuration. In the embodiment, the insulation layer 13, the skin layer 42, and the heater layer 32 have the same cross-linked polymer. In other words, the skin layer 42 and the heater layer 32 are formed by using the same thermoplastic polymer as that of the insulation layer 13. Therefore, by laminating and integrally heating the polymer sheets before the cross-linking for forming these layers, the fusions to the detection electrode layer 11 and the shield electrode layer 12 and the cross-linking can be performed at the same time. Because it is not necessary to use the adhesive to adhere each layer, the adhesive coating step is not required, and the manufacturing steps and the cost can be reduced. Because the softened thermoplastic polymer is impregnated in the conductive cloths which are the detection electrode layer 11 and the shield electrode layer 12, the layers are unlikely to be separated from each other, and the reliability is high. Because no adhesive layer is interposed, the sensor can be made thinner by the thickness of the adhesive layer. As a result, the thermal resistance is reduced and the thermal conductive property is also improved. Furthermore, the designability is also improved. In addition, because of having the cross-linked polymer, the skin layer 42 has excellent heat resistance to direct sunlight, high rigidity, and excellent settling resistance and chemical resistance. In addition, the heater layer 32 also has excellent heat resistance to the heating wire, high rigidity, and excellent settling resistance and chemical resistance.

OTHER EMBODIMENTS

The embodiments of the capacitive coupling sensor of the present disclosure are described above. However, the embodiment is not limited to the above-described forms. Various modified forms and improved forms that can be performed by the person skilled in the art can also be implemented.

[Sensor Unit]

(1) Insulation Layer

The cross-linked polymer used in the insulation layer is not particularly limited as long as it is a cross-linked product of the thermoplastic polymer. The thermoplastic polymer may be one type or two or more types, and may be appropriately selected from, for example, styrene-based, olefin-based, vinyl chloride-based, urethane-based, ester-based, and amide-based resins or elastomers and other resins or elastomers. It is desirable that the thermoplastic polymer has a relatively low softening temperature and can be kneaded at 140° C. or less. For example, the styrene-based thermoplastic elastomer may be SBS, SEBS, SEPS, and the like. The olefin-based thermoplastic elastomer may be a copolymer of ethylene and α-olefin (an ethylene-octene copolymer) and the like in addition to LDPE, LLDPE, EEA, EMA, EMMA, and the like. The cross-linking method is not particularly limited. The cross-linking using cross-linking agents such as an organic peroxide, an organometallic compound, and the like may be adopted, and the cross-linking using electromagnetic waves such as gamma rays, ultraviolet rays, and the like may also be adopted.

The insulation layer may contain components other than the cross-linked polymer. For example, when a rubber such as an ethylene-propylene rubber (EPM or EPDM) or the like is included, the flexibility of the insulation layer is improved. From the viewpoint of improving the flexibility of the insulation layer, a flexibility-imparting component such as a plasticizer or the like may be contained in the insulation layer. When the insulation particle is contained, the insulation property is improved.

If a particle having relatively large thermal conductivity is contained, the thermal conductivity of the insulation layer can be increased. In this case, an insulation particle having thermal conductivity of 5 W/m·K or more is preferable, and may be, for example, magnesium hydroxide, magnesium oxide, aluminum oxide, aluminum nitride, boron nitride, silicon carbide, or the like. Preferable thermal conductivity of the insulation layer is 0.25 W/m·K or more, 0.4 W/m·K or more, and further 0.5 W/m·K or more. In addition, from the viewpoint of imparting the flame retardant property to the insulation layer, it is desirable to contain a particle having flame retardant property. This particle may be magnesium hydroxide, aluminum hydroxide, boron nitride, or the like.

From the viewpoint of improving the tactile quality of the sensor and the assembly property to the member, the insulation layer is desired to be flexible. For example, the type A durometer hardness of the insulation layer is preferably 35 or more and less than 90. When the hardness is 90 or more, a person feels hard when touching the sensor, and the tactile quality is reduced. On the contrary, when the hardness is less than 35, the sensor is too soft and difficult to be handled, and thus the workability at the time of assembling is reduced. In addition, from the viewpoint of improving the assembly property and the durability, the tensile strength of the insulation layer is preferably 0.1 MPa or more, and further preferably 2.0 MPa or more. A 25% test force of the insulation layer is preferably 40 N or less, and further preferably 25 N or less. Here, the 25% test force is a force required to extend a test piece by 25% in the uniaxial direction. If the 25% test force is small, the work of assembling while stretching becomes easy. A specific measurement method of the 25% test force is described in the following example.

From the viewpoint of ensuring the insulation property between the detection electrode layer and the shield electrode layer and maintaining the sensor function, the volume resistivity of the insulation layer is preferably $1 \times 10^{12}$ Ω·cm or more. Preferable volume resistivity is $1 \times 10^{13}$ Ω·cm or more. The insulation layer is arranged between the detection electrode layer and the shield electrode layer. The insulation layer may be interposed between the two electrode layers, and may also be impregnated in the electrode layers or merely in contact with the electrode layers without being impregnated in the electrode layers. From the viewpoints of the flexibility, the thermal conductive property, the designability, and the like, the thickness of the insulation layer is preferably 1 mm or less. Preferably, the thickness of the insulation layer is 0.7 mm or less and 0.5 mm or less. In addition, from the viewpoints of the insulation property and the like, the thickness of the insulation layer is preferably 0.1 mm or more.

(2) Detection Electrode Layer

The detection electrode layer is desired to be conductive and flexible. Preferable volume resistivity of the detection electrode layer is less than 10 Ω·cm. It is more preferable if the volume resistivity is 1 Ω·cm or less. The detection electrode layer can be formed from a conductive polymer or a conductive cloth.

When the conductive polymer is used, the shape of the detection electrode layer may be either a sheet or a mesh. If the detection electrode layer is formed into a mesh shape, the flexibility is improved, and thus even when the detection electrode layer is stretched greatly, the detection electrode layer is unlikely to be broken, and the conductivity is unlikely to be reduced. In addition, because the electrode area can be changed by changing the line width, pitch, and the like, the capacitance generated between the two electrode layers can be adjusted.

The conductive polymer can be manufactured by, for example, blending a conductive material with a polymer. Alternatively, after the polymer is formed into a predetermined shape, the surface may be covered with a metal or the like to impart the conductivity. As the polymer, one or more selected from cross-linked rubbers and the thermoplastic elastomers may be used, wherein the cross-linked rubbers include, for example, an acrylic rubber, a silicone rubber, a urethane rubber, a urea rubber, a fluoro-rubber, a nitrile rubber, a hydride nitrile rubber, and the like. The conductive material may be appropriately selected from metal particles including silver, gold, copper, nickel, rhodium, palladium, chromium, titanium, platinum, iron, alloys thereof, and the like; metal oxide particles including zinc oxide, titanium oxide, and the like; metal carbide particles including titanium carbonate and the like; metal nanowires including silver, gold, copper, platinum, nickel, and the like; and conductive carbon materials such as carbon black, carbon nanotubes, graphite, thin layer graphite, graphene, and the like. The conductive polymer may contain a cross-linking agent, a cross-linked accelerator, a dispersant, a reinforcing material, a plasticizer, an antiaging agent, a coloring agent, and the like.

A woven fabric, a nonwoven fabric, or the like of conductive fibers may be used as the conductive cloth. The conductive fibers may be fibers obtained by plating highly conductive copper, nickel, or the like on polyester fibers such as polyethylene terephthalate (PET) or the like.

(3) Shield Electrode Layer

The shield electrode layer is desired to have high conductivity from the viewpoint of shielding noise to the detection electrode layer. Preferable volume resistivity of the shield electrode layer is less than $1 \times 10^{-1}$ Ω·cm. The material of the shield electrode layer may be the same as or different from that of the detection electrode layer. That is, the polymer electrode which is made of a conductive polymer and is mesh-like or sheet-like, the conductive cloth, or the like may be used. In order to realize both high conductivity and flexibility, it is desirable that the shield electrode layer is formed from the above-described conductive cloth.

[Skin Layer]

The capacitive coupling sensor of the present disclosure does not necessarily need to have a skin layer. However, in consideration of the protection of the detection electrode layer, the ensuring of the insulation property, the designability of the member, and the like, it is preferable to arrange a skin layer on the front side of the sensor unit (the outer side of the detection electrode layer). The material of the skin layer may be appropriately selected from leather, resin, elastomer, and the like. When the skin layer is formed from a resin or an elastomer, the skin layer may be cross-linked or not be cross-linked. When the skin layer has a cross-linked polymer as in the second embodiment, the heat resistance to direct sunlight or the like is improved. For example, when the thermoplastic polymer used in the insulation layer is used, because the softening temperature is the same, the insulation layer and the skin layer can be fused to the detection electrode layer at the same time regardless of the presence or absence of the cross-linking in the skin layer. Here, when the detection electrode layer is made of a mesh-like polymer electrode or a conductive cloth, the softened thermoplastic polymer is mixed together through holes of the detection electrode layer. Thereby, the insulation layer and the skin layer are firmly adhered to each other via the detection electrode layer. The thickness of the skin layer is not particularly limited, and is preferably about 0.5 mm or more and 1.5 mm or less in consideration of the heat resistance, the flexibility, the designability, and the like.

[Heater Layer]

The capacitive coupling sensor of the present disclosure does not necessarily need to have a heater layer. When the capacitive coupling sensor is arranged in the steering wheel as in the above-described embodiment, the heater layer is preferably arranged on the back side of the sensor unit (the inner side of the shield electrode layer) in order to reduce the driver's discomfort at a low temperature. The configuration of the heater layer and the like are not particularly limited, and the heating wire or the like which serves as a heat source may be arranged in the nonwoven fabric or the polymer. When the heater layer is formed from a resin or an elastomer, the heater layer may be cross-linked or not be cross-linked. When the heater layer has a cross-linked polymer as in the second embodiment, the heat resistance to the heat source or the like is improved. For example, when the polymer having low thermal conductivity is used to reduce the thermal conductivity of the heater layer, heat transfer to the core body side is suppressed, and thus the thermal conductive property to the sensor unit and the skin layer side can be selectively improved. In addition, when the thermoplastic polymer used in the insulation layer is used, because the softening temperature is the same, the insulation layer and the heater layer can be fused to the shield electrode layer at the same time regardless of the presence or absence of the cross-linking in the heater layer. Here, when the shield electrode layer is made of a mesh-like polymer electrode or a conductive cloth, the softened thermoplastic polymer is mixed together through holes of the shield electrode layer. Thereby, the insulation layer and the heater layer are firmly adhered to each other via the shield electrode layer. The thickness of the heater layer is not particularly limited, and is preferably about 1.5 mm or more and 3.0 mm or less in consideration of the heat resistance, the flexibility, the designability, and the like.

[Manufacturing Method]

In the capacitive coupling sensor of the present disclosure, the method of fixing the three layers configuring the sensor unit and fixing the sensor unit to the skin layer and the heater layer is not particularly limited. An adhesive may be used, or adhesion or fusion of a polymer may be used. It is desirable that at least one of fixation between the detection electrode layer and the insulation layer and fixation between the shield electrode layer and the insulation layer is performed without using an adhesive. In the first embodiment, the sensor unit is adhered to the skin layer and the heater layer by an adhesive. For example, after the cross-linking of the thermoplastic polymer is completed and the insulation layer is formed, the insulation layer may be adhered to the detection electrode layer and the shield electrode layer.

When an adhesive is used, the type of the adhesive is not particularly limited. For example, the adhesive may be an acrylic-based adhesive and the like. Alternatively, a thermoplastic resin which has the type A durometer hardness of less than 35 and has adhesiveness may be arranged and fixed by the adhesive force thereof. In addition, when the layers are fixed to each other by heat-pressing (pressurizing under heating) as in the above-described embodiment, conditions such as the temperature, the pressure, the time, and the like may be appropriately determined in consideration of the softening temperature of the polymer contained in each layer, cross-linking conditions, and the like.

[Application]

The detection target of the capacitive coupling sensor of the present disclosure may be a human hand or the like. The capacitive coupling sensor of the present disclosure is arranged in, in addition to the steering wheel, interior components such as a door trim, an armrest, a console box, an instrument panel, a headrest, a seat, and the like of a vehicle, and is preferably used as a sensor that detects proximity and contact of a person.

EXAMPLE

Next, the present disclosure is described more specifically with reference to examples.

Manufacturing of Capacitive Coupling Sensor

Example 1

First, 150 parts by mass of magnesium oxide powder ("RF-50SC" manufactured by Ube Materials Co., Ltd., the thermal conductivity is 45 W/m·K) and 150 parts by mass of magnesium hydroxide powder ("Kisuma (registered trademark) 5L" manufactured by Kyowa Chemical Industry Co., Ltd., the thermal conductivity is 8 W/m·K) which are used as insulation particles, and 3 parts by weight of an organic peroxide ("Percumyl (registered trademark) D-40" manufactured by NOF Corporation) which is used as a cross-linking agent were added to 50 parts by mass of a styrene-based thermoplastic elastomer (SEBS) ("Tuftec (registered trademark) H1221" manufactured by Asahi Kasei Corporation) and 100 parts by mass of an olefin-based thermoplastic elastomer A ("ENGAGE (registered trademark) XLT8677" manufactured by Dow Chemical Japan Co., Ltd.), and were kneaded at 130° C. by a kneading machine ("Laboplastomill (registered trademark)" manufactured by Toyo Seiki Seisaku-sho, Ltd.) to obtain a polymer composition. The obtained polymer composition was heat-pressed at 130° C. by a press molding machine (150 ton press machine manufactured by Sanyu Industries Co., Ltd.) to manufacture a polymer sheet having a thickness of 0.6 mm. At this point of time, the cross-linking of the thermoplastic elastomer A has not yet been completed.

Next, the manufactured polymer sheet was cut to a predetermined size, and the polymer sheet was sandwiched by two conductive cloths ("*Sui*-10-511M" manufactured by Seiren Co., Ltd.) to prepare a lamination body. Then, the lamination body was heat-pressed at 180° C. for 30 minutes by the press molding machine (same as above) to fuse the conductive cloths on both surfaces of the polymer sheet in the thickness direction, and the cross-linking of the thermoplastic elastomer A was completed. In this way, the capacitive coupling sensor (hereinafter simply referred to as "the sensor") including the conductive cloth (the detection electrode layer)/the cross-linked polymer sheet (the insulation layer)/the conductive cloth (the shield electrode layer) was manufactured. In the manufactured sensor, the conductive cloths were almost entirely embedded in the cross-linked polymer sheet.

Example 2

The sensor of Example 2 was manufactured in the same manner as in Example 1 except that the blending amount of the styrene-based thermoplastic elastomer A was changed to 100 parts by mass and the blending amount of the olefin-based thermoplastic elastomer A was changed to 50 parts by mass.

Example 3

The sensor of Example 3 was manufactured in the same manner as in Example 1 except that the magnesium oxide powder which is used as an insulation particle was not blended.

Example 4

The sensor of Example 4 was manufactured in the same manner as in Example 1 except that the styrene-based thermoplastic elastomer (SEBS) was not blended.

Example 5

The sensor of Example 5 was manufactured in the same manner as in Example 1 except that the thickness of the polymer sheet was 1.5 mm.

Example 6

First, 100 parts by mass of the magnesium hydroxide powder (same as above) which is used as an insulation particle and 3 parts by weight of the organic peroxide (same as above) which is used as a cross-linking agent were added to 100 parts by mass of an olefin-based thermoplastic elastomer B ("ENGAGE (registered trademark) 8180" manufactured by Dow Chemical Japan Co., Ltd.), and were kneaded at 100° C. by the kneading machine (same as above) to obtain a polymer composition. The obtained polymer composition was heat-pressed at 110° C. by the press molding machine (same as above) to manufacture a polymer sheet having a thickness of 0.6 mm. At this point of time, the cross-linking of the thermoplastic elastomer has not yet been completed.

Next, the manufactured polymer sheet was cut to a predetermined size, and the polymer sheet was sandwiched by two conductive cloths (same as above) to prepare a lamination body. Then, the lamination body was heat-pressed at 180° C. for 30 minutes by the press molding machine (same as above) to fuse the conductive cloths on both surfaces of the polymer sheet in the thickness direction, and the cross-linking of the thermoplastic elastomer was completed. In this way, the sensor including the conductive cloth (the detection electrode layer)/the cross-linked polymer sheet (the insulation layer)/the conductive cloth (the shield electrode layer) was manufactured. In the manufactured sensor, the conductive cloths were almost entirely embedded in the cross-linked polymer sheet.

Example 7

The sensor of Example 7 was manufactured in the same manner as in Example 6 except that the blending amount of the cross-linking agent (the organic peroxide) was changed to 1.5 parts by mass.

Example 8

The sensor of Example 8 was manufactured in the same manner as in Example 6 except that the blending amount of the cross-linking agent (the organic peroxide) was changed to 1 part by mass.

Example 9

The sensor of Example 9 was manufactured in the same manner as in Example 7 except that the blending amount of the insulation particle (the magnesium hydroxide powder) was changed to 75 parts by mass.

Example 10

The sensor of Example 10 was manufactured in the same manner as in Example 7 except that the blending amount of the insulation particle (the magnesium hydroxide powder) was changed to 125 parts by mass.

Comparative Example 1

The sensor of Comparative example 1 was manufactured in the same manner as in Example 1 except that the thermoplastic elastomer was not cross-linked without blending the cross-linking agent (the organic peroxide). In the sensor of Comparative example 1, the conductive cloths of the electrode layers were also almost entirely embedded in the polymer sheet.

Comparative Example 2

The sensor of Comparative example 2 was manufactured in the same manner as in Example 6 except that the thermoplastic elastomer was not cross-linked without blending the cross-linking agent (the organic peroxide). In the sensor of Comparative example 2, the conductive cloths of the electrode layers were also almost entirely embedded in the polymer sheet.

<Measurement of Physical Properties of Insulation Layer>

The type A durometer hardness, the thermal conductivity, the 25% test force, the 25% modulus, the tensile strength, and the heat resistance of the cross-linked polymer sheet (hereinafter referred to as "the insulation layer") of examples and comparative examples which configures the sensor were measured. The measurement method is as follows.

[Type A Durometer Hardness]

The type A durometer hardness was measured in a state in which the insulation layers were stacked to the thickness of 6 mm by using a hardness tester ("ASKER P1-A type" manufactured by Kobunshi Keiki Co., Ltd.) based on JIS K6253-3: 2012. As the type A durometer hardness, an instantaneous value immediately after a push needle and the insulation layer come into contact was adopted.

[Thermal Conductivity]

The thermal conductivity was measured by using "HC-110" manufactured by EKO Instruments Co., Ltd. based on a heat flow metering method of JIS A1412-2: 1999.

[25% Test Force, 25% Modulus, and Tensile Strength]

A tensile test specified in JIS K6251: 2017 was performed to measure the force applied to a test piece when the test piece was stretched by 25% (25% test force), the tensile stress (the 25% modulus), and the tensile strength. The tensile test was performed using a dumbbell-shaped No. 2 test piece at a tensile speed of 100 mm/min.

[Heat Resistance]

A sample of the insulation layer cut into a strip shape having a width of 10 mm was set on a table-top type precision universal tester "AGS-X" manufactured by Shimadzu Corporation with a length between chucks of 20 mm, and was stationarily placed for one hour in an atmosphere of 150° C. Thereafter, the tensile test based on JIS K6251: 2017 was performed (the tensile speed was set to 100 mm/min), and the insulation layer was evaluated as having heat resistance (indicated by ○ in Table 1 below) when the tensile strength is 1 MPa or more, and was evaluated as having no heat resistance (indicated by x in the same table) when the tensile strength is less than 1 MPa.

The components, the thickness, and the measurement result of the physical properties of the insulation layer are summarized and shown in Table 1 and Table 2.

TABLE 1

| Raw material (parts by mass) | | Example 1 | Example 2 | Example 3 | Example 4 | Example 5 | Comparative example 1 |
|---|---|---|---|---|---|---|---|
| Thermoplastic polymer | Styrene-based thermoplastic elastomer | 50 | 100 | 50 | — | 50 | 50 |
| | Olefin-based thermoplastic elastomer A | 100 | 50 | 100 | 100 | 100 | 100 |
| Insulation particle | Magnesium oxide | 150 | 150 | — | 150 | 150 | 150 |
| | Magnesium hydroxide | 150 | 150 | 150 | 150 | 150 | 150 |
| Cross-linking agent | Organic peroxide | 3 | 3 | 3 | 3 | 3 | — |
| Thickness of insulation layer [mm] | | 0.6 | 0.6 | 0.6 | 0.6 | 1.5 | 0.6 |
| Measurement result of physical properties | Type A durometer hardness | 85 | 80 | 76 | 88 | 85 | 77 |
| | Thermal conductivity [W/m · K] | 0.66 | 0.65 | 0.28 | 0.72 | 0.66 | 0.64 |
| | 25% test force [N] | 13 | 11 | 7 | 14 | 30 | 6 |
| | 25% modulus [MPa] | 2.1 | 1.8 | 1.1 | 2.4 | 2.1 | 1.0 |
| | Tensile strength [MPa] | 6.5 | 7.0 | 3.2 | 6.0 | 6.5 | 2.7 |
| | Evaluation of heat resistance | ○ | ○ | ○ | ○ | ○ | x |

TABLE 2

| Raw material (parts by mass) | | Example 6 | Example 7 | Example 8 | Example 9 | Example 10 | Comparative example 2 |
|---|---|---|---|---|---|---|---|
| Thermoplastic polymer | Styrene-based thermoplastic elastomer | — | — | — | — | — | — |
| | Olefin-based thermoplastic elastomer B | 100 | 100 | 100 | 100 | 100 | 100 |
| Insulation particle | Magnesium oxide | — | — | — | — | — | — |
| | Magnesium hydroxide | 100 | 100 | 100 | 75 | 125 | 100 |
| Cross-linking agent | Organic peroxide | 3 | 1.5 | 1 | 1.5 | 1.5 | - |
| Thickness of insulation layer [mm] | | 0.6 | 0.6 | 0.6 | 0.6 | 0.6 | 0.6 |

TABLE 2-continued

| Raw material (parts by mass) | | Example 6 | Example 7 | Example 8 | Example 9 | Example 10 | Comparative example 2 |
|---|---|---|---|---|---|---|---|
| Measurement result of physical properties | Type A durometer hardness | 73 | 74 | 71 | 69 | 77 | 74 |
| | Thermal conductivity [W/m · K] | 0.36 | 0.40 | 0.38 | 0.31 | 0.42 | 0.35 |
| | 25% test force [N] | 15 | 13 | 12 | 9 | 15 | 12 |
| | 25% modulus [MPa] | 1.9 | 1.8 | 1.7 | 1.4 | 2.1 | 1.4 |
| | Tensile strength [MPa] | 14.2 | 14.0 | 12.1 | 13.1 | 14.2 | 4.0 |
| | Evaluation of heat resistance | ○ | ○ | ○ | ○ | ○ | x |

First, as shown in Table 1, it is confirmed that the insulation layers of Examples 1 to 5 configuring the sensor have excellent heat resistance. In contrast, in the insulation layer of Comparative example 1 configuring the sensor, the thermoplastic elastomer is not cross-linked, in other words, the insulation layer does not have the cross-linked polymer, and thus the heat resistance is lowered and the tensile strength is also reduced.

The thermal conductivity of the insulation layers of Examples 1 to 5 configuring the sensor is 0.25 W/m·K or more, and the thermal conductivity is increased particularly in the insulation layers of Examples 1, 2, 4, and 5 having the magnesium oxide particle is increased. The type A durometer hardness is less than 90 in any of the insulation layers of Examples 1 to 5, and thus it is seen that these insulation layers are flexible. Particularly, the insulation layers of Examples 1 to 4 have a small value of the 25% test force, and thus these insulation layers are easily stretched and have excellent handleability. On the other hand, the thickness of the insulation layer of Example 5 is twice or more than that of the insulation layers of other examples. Therefore, the value of the 25% test force is increased. The sensor of Example 5 is not suitable for applications that require assembly while being stretched, for example, the steering wheel and the like.

Next, as shown in Table 2, it is confirmed that the insulation layers of Examples 6 to 10 configuring the sensor have excellent heat resistance. In contrast, in the insulation layer of Comparative example 2 configuring the sensor, the thermoplastic elastomer is not cross-linked, in other words, the insulation layer does not have the cross-linked polymer, and thus the heat resistance is lowered and the tensile strength is also reduced. Moreover, in the insulation layers of Examples 6 to 10, the olefin-based thermoplastic elastomer B is used as a thermoplastic elastomer. Because the olefin-based thermoplastic elastomer B has a lower melting point than those of the styrene-based thermoplastic elastomer and the olefin-based thermoplastic elastomer A which are used in the insulation layers of Examples 1 to 5, the kneading temperature and the heat-pressing temperature at the time of manufacturing the polymer sheet can be lowered.

The insulation layers of Examples 6 to 10 configuring the sensor contain only the magnesium hydroxide powder as an insulation particle having high thermal conductivity, and does not contain the magnesium oxide powder. However, the thermal conductivity of the insulation layer is 0.31 W/m·K or more, and the thermal conductivity is sufficiently increased. The type A durometer hardness is also less than 90 in any of the insulation layers of Examples 6 to 10, and thus it is seen that these insulation layers are flexible. In addition, the insulation layers of Examples 6 to 10 have a small value of the 25% test force, and thus these insulation layers are easily stretched and have excellent handleability. Thus, it is confirmed that the capacitive coupling sensor which is thin but has high heat resistance and an excellent tactile quality can be configured according to the insulation layer specified in the present disclosure.

What is claimed is:

1. A capacitive coupling sensor, comprising:
    a sensor unit, comprising:
        a detection electrode layer which generates capacitance between the detection electrode layer and a detection target,
        a shield electrode layer, and
        an insulation layer, which has a front surface and a back surface, the detection electrode layer is stacked on the front surface of the insulation layer and is embedded in the insulation layer, and the shield electrode layer is stacked on the back surface of the insulation layer and is embedded in the insulation layer,
    wherein the insulation layer has a cross-linked polymer obtained by cross-linking of a thermoplastic polymer, the insulation layer has an insulation particle having thermal conductivity of 20 W/m·K or more.

2. The capacitive coupling sensor according to claim 1, wherein a thickness of the insulation layer is 0.1 mm or more and 1 mm or less.

3. The capacitive coupling sensor according to claim 1, wherein at least one of fixation between the detection electrode layer and the insulation layer and fixation between the shield electrode layer and the insulation layer is performed without using an adhesive.

4. The capacitive coupling sensor according to claim 1, further comprising a heater layer, wherein, with a lamination direction from the detection electrode layer toward the shield electrode layer in the sensor unit defined as a front and back direction,
    the heater layer is arranged on a back side of the sensor unit, and
    the heater layer has a heat source and a cross-linked polymer obtained by cross-linking of a thermoplastic polymer.

5. The capacitive coupling sensor according to claim 4, wherein the shield electrode layer and the heater layer are fixed without using an adhesive.

6. The capacitive coupling sensor according to claim 1, further comprising a skin layer, wherein, with the lamination direction from the detection electrode layer toward the shield electrode layer in the sensor unit defined as a front and back direction, the skin layer is arranged on a front side of the sensor unit, and the skin layer has a cross-linked polymer obtained by cross-linking of a thermoplastic polymer.

7. The capacitive coupling sensor according to claim 6, wherein the detection electrode layer and the skin layer are fixed without using an adhesive.

8. The capacitive coupling sensor according to claim 1, further comprising a skin layer and a heater layer, wherein, with the lamination direction from the detection electrode layer toward the shield electrode layer in the sensor unit defined as a front and back direction, the skin layer is arranged on a front side of the sensor unit, the heater layer is arranged on a back side of the sensor unit and has a heat source, and the insulation layer, the skin layer, and the heater layer have the same cross-linked polymer.

9. The capacitive coupling sensor according to claim 1, wherein the thermoplastic polymer has an olefin-based resin or an elastomer.

10. The capacitive coupling sensor according to claim 1, wherein the detection electrode layer and the shield electrode layer are made of a conductive polymer or a conductive cloth.

11. The capacitive coupling sensor according to claim 10, wherein the detection electrode layer and the shield electrode layer are made of a mesh-like conductive polymer or a conductive cloth, and at least a part of the detection electrode layer and the shield electrode layer is embedded in the insulation layer.

12. The capacitive coupling sensor according to claim 1, which is arranged in a steering wheel.

* * * * *